US006931087B1

(12) United States Patent
Karol

(10) Patent No.: US 6,931,087 B1
(45) Date of Patent: Aug. 16, 2005

(54) FEEDFORWARD CLOCK SWITCHING CIRCUIT

(75) Inventor: Gregory Michael Karol, Norton, MA (US)

(73) Assignee: Invensys Systems, Inc., Foxboro, MA (US)

( * ) Notice: Subject to any disclaimer, the term of this patent is extended or adjusted under 35 U.S.C. 154(b) by 0 days.

(21) Appl. No.: 09/181,253

(22) Filed: Oct. 28, 1998

Related U.S. Application Data

(60) Provisional application No. 60/082,203, filed on Apr. 17, 1998.

(51) Int. Cl.[7] .............................................. H03D 3/24
(52) U.S. Cl. ...................................................... 375/376
(58) Field of Search ............................... 375/294, 376, 375/371, 354, 377, 293, 286

(56) References Cited

U.S. PATENT DOCUMENTS

| | | | | |
|---|---|---|---|---|
| 4,208,635 A | * | 6/1980 | Fazakerly et al. | 327/552 |
| 4,805,040 A | * | 2/1989 | Oku et al. | 386/85 |
| 5,648,964 A | * | 7/1997 | Inagaki et al. | 370/228 |
| 5,740,211 A | * | 4/1998 | Bedrosian | 327/147 |
| 5,870,441 A | * | 2/1999 | Cotton et al. | 375/354 |
| 5,977,806 A | * | 11/1999 | Kikuchi | 327/157 |
| 6,072,343 A | * | 6/2000 | Dmitroca | 327/144 |
| 6,078,225 A | * | 6/2000 | Bontekoe et al. | 331/14 |
| 6,108,046 A | * | 8/2000 | Wu et al. | 348/558 |
| 6,163,186 A | * | 12/2000 | Kurita | 327/157 |
| 6,173,023 B1 | * | 1/2001 | Tanonaka et al. | 375/357 |
| 6,178,207 B1 | * | 1/2001 | Richards et al. | 342/450 |
| 2005/0012525 A1 | * | 1/2005 | Starr et al. | 327/18 |

* cited by examiner

Primary Examiner—Tesfaldet Bocure
Assistant Examiner—Pankaj Kumar
(74) Attorney, Agent, or Firm—Foley Hoag LLP

(57) ABSTRACT

A clocking circuit includes primary and secondary clock sources. These sources are input to a multiplexer which selectively chooses between them. A PLL stabilizes the output of the multiplexer. A clock detection circuit monitors the presence of the primary clock source and drives the multiplexer such that if the primary clock source fails, the backup clock is selected. Also upon clock switchover, a feedforward correction circuitry modifies a time constant within the PLL to mitigate clock skew during switchover.

14 Claims, 4 Drawing Sheets

FEEDFORWARD CLOCK SWITCHING CIRCUIT

CROSS REFERENCE TO RELATED APPLICATIONS

This patent application is related to co-pending provisional patent application entitled, "High Speed Fault Tolerant Real Time Synchronous Computer Clock Design" filed Apr. 17, 1998 and assigned Ser. No. 60/082,203 which is incorporated by reference herein in its entirety.

TECHNICAL FIELD

This invention relates, in general, to clocking circuits. More specifically, the present invention relates to a feedforward control circuit and associated clocking circuitry.

BACKGROUND OF THE INVENTION

Robust and reliable clocking circuits are important to many types of electronic circuitry, particularly circuitry which includes microprocessors. In many systems, a single local oscillator will serve as the clock. However, any disturbance to that clock will adversely effect the operation of the circuits which the clock drives.

In order to obtain a more robust clocking topology, previous circuits have included multiple clock sources. Of those sources, a multiplexer may be used to select an active clocking source. In the event that the current clock source fails, this failure is detected and an alternate clock is selected through use of the multiplexer. Unfortunately, during this failure detection and switchover time, the driven circuitry may see a noisy, irregular or even missing clock signal.

This same problem is present in situations where multiple circuits must run off a common clock, but fall back to a local clock in the event of common clock failure. For example, multiple circuits may share a common clock provided over a bus. Using the above-described techniques, when the bus provided clock fails, a local oscillator is engaged to take over circuit clocking. Of course, this switchover to local clocking leads to all of the above-described problems. This configuration also applied to fault-tolerant systems where multiple identical modules may be clocked off of a "master" module, or other central clocking source. The present invention is directed toward solutions to the above-identified problems.

SUMMARY OF THE INVENTION

In a first aspect, the present invention includes a clock circuit comprising multiple clock sources, for example, first and second clock sources. A multiplexer has its first input coupled to the first clock source and its second input coupled to the second clock source. The multiplexer output is selectively couplable to its inputs, through a selection input.

The invention also includes a clock detection circuit having an output representing a presence of the first clock source. Further, the multiplexer's selection input is coupled to the clock detection circuit output such that the multiplexer selects the first clock source as its output when the first clock source is present.

A phase-locked loop circuit ("PLL") is also included and processes the multiplexer output to produces its own output. The PLL circuit includes a feedback filter circuit. Feedforward circuitry is coupled to the PLL's feedback filter circuit and to the clock detection circuit output. This feedforward circuitry selectively couples at least one circuit element to the PLL filter circuit as controlled by the clock detection circuit output.

As an enhancement, the feedforward circuitry may include a switch, e.g., a transistor controlled by the clock detection circuit output, wherein the switch performs the selective coupling. A bias circuit may couple the clock detection circuit to the switch.

The at least one circuit element may include, e.g., a resistor or, e.g., a capacitor in parallel with a resistor. Further, a resistor or capacitor may be placed in parallel with the switch.

As a further enhancement, the first clock source may be received from another clock circuit within a common system. For example, the first clock source may be received over a bus. The second clock source may be a local oscillator, and may be, for example, provided to the bus.

In another embodiment, the present invention includes a circuit having a clock source, a PLL circuit, a detection circuit, and a feedforward correction circuit. The PLL circuit has the clock source as its input. The detection circuit is coupled to the clock source and has an output responsive to a presence of the clock source. The feedforward correction circuit is coupled to the output of the detection circuit and to a feedback loop of the PLL.

In yet another embodiment, the present invention includes a method for controlling a clocking circuit which includes a clock source coupled to an input of a phase-locked loop ("PLL"). The method includes detecting a failure of the clock source, and in response thereto, applying a control signal to the PLL which alters a time constant within the PLL. More particularly, and as an enhancement, altering the time constant includes modifying a feedback loop within the PLL by way of the control signal. This altering may include, e.g., engaging or disengaging at least one circuit element into the feedback loop in response to the control signal.

Advantageously, the present invention overcomes the deficiencies of prior clocking circuits in that it provides a stable clock output during both detection of clock failure and switchover to an alternate source. This advantage is realized through the use of a feedforward correction technique in association with the PLL. By making use of the clock detection circuit output, a feedforward correction circuit is used to modify the time constant of the PLL thereby stabilizing drift of the PLL during clock switchover. Tighter tolerances on clock skew are thereby maintained such that clock perturbations associated with clock swithover are mitigated. Thus, the invention disclosed herein is useful in the field of electronic clock circuits and is an advance thereof.

DETAILED DESCRIPTION OF A PREFERRED EMBODIMENT

Figure 1:
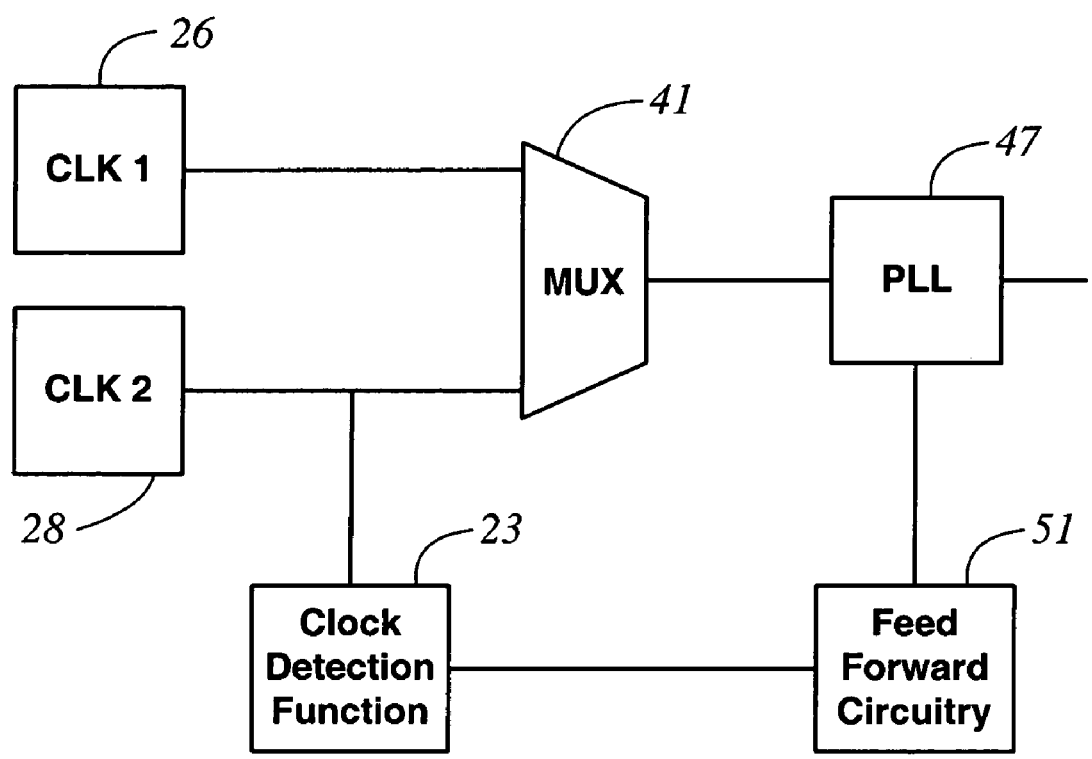
FIG. 1 depicts a block diagram of a clock switchover circuit pursuant to an embodiment of the present invention.

Turning to FIG. 1, a block diagram of a feedforward clock switching circuit is depicted in accordance with the present invention. A multiplexer 41 is switchable between two inputs, one being clock 1 26, the other being clock 2 28. For the purpose of this example, clock 2 28 is a primary clock, while clock 1 26 is a secondary clock. The output of muliplexer 41 is directed to phase-locked loop 47 ("PLL"). PLL 47 serves to stabilize the clock output. A clock detection function 23 monitors clock 2 28 and has an output coupled to both a select input of muliplexor 41 and feedforward circuitry 51. Feed forward circuitry 51 is controlled by the output of clock detection circuit 23 and is coupled to PLL 47 to influence the behavior thereof.

Operationally, multiplexer 41 normally selects clock 2 28 for its output which passes through PLL 47 where it is stabilized in the frequency domain and output. If clock 2 28 fails, this will be detected after a certain period of time by clock detector 23 which will cause multiplexer 41 to switch to the secondary clock, clock 1 26. Also, feedforward circuit 51 will act on PLL 47 to ease the transition between the clocks. The interaction of feedforward circuitry 51 and PLL 47 will serve to mitigate any clock skew that occurs between the time that clock 2 28 fails, and the time such failure is detected and alternate clock 1 26 is selected by detector 23.

Both clock sources clock 1 26 and clock 2 28 may be any clocking means or any clock providing mechanism known in the art including various types of oscillators, both local and remote. Similarly, multiplexer 41 may be selected from any available muliplexer technology. Detector 23 may be any circuit or element that is able to detect clock failure and provide an output based thereon. This can include, for example, an astable multivibrator with its time constant longer than the clock it must detect, or may be implemented in a combination of hardware and software, or exclusively software using timer functions within a processor. For example, the processor may have a logic level input and output that provides the input and output of detector 23. PLL 47 may be selected from any commercially available PLL 47 circuit, or known configuration; while feedforward circuit 51 influences the time constant of the feedback within the PLL circuit based upon a received control signal from detector 23.

In some systems, based on design option, the entirety of the circuit and elements therein may be implemented using only software.

Figure 2:
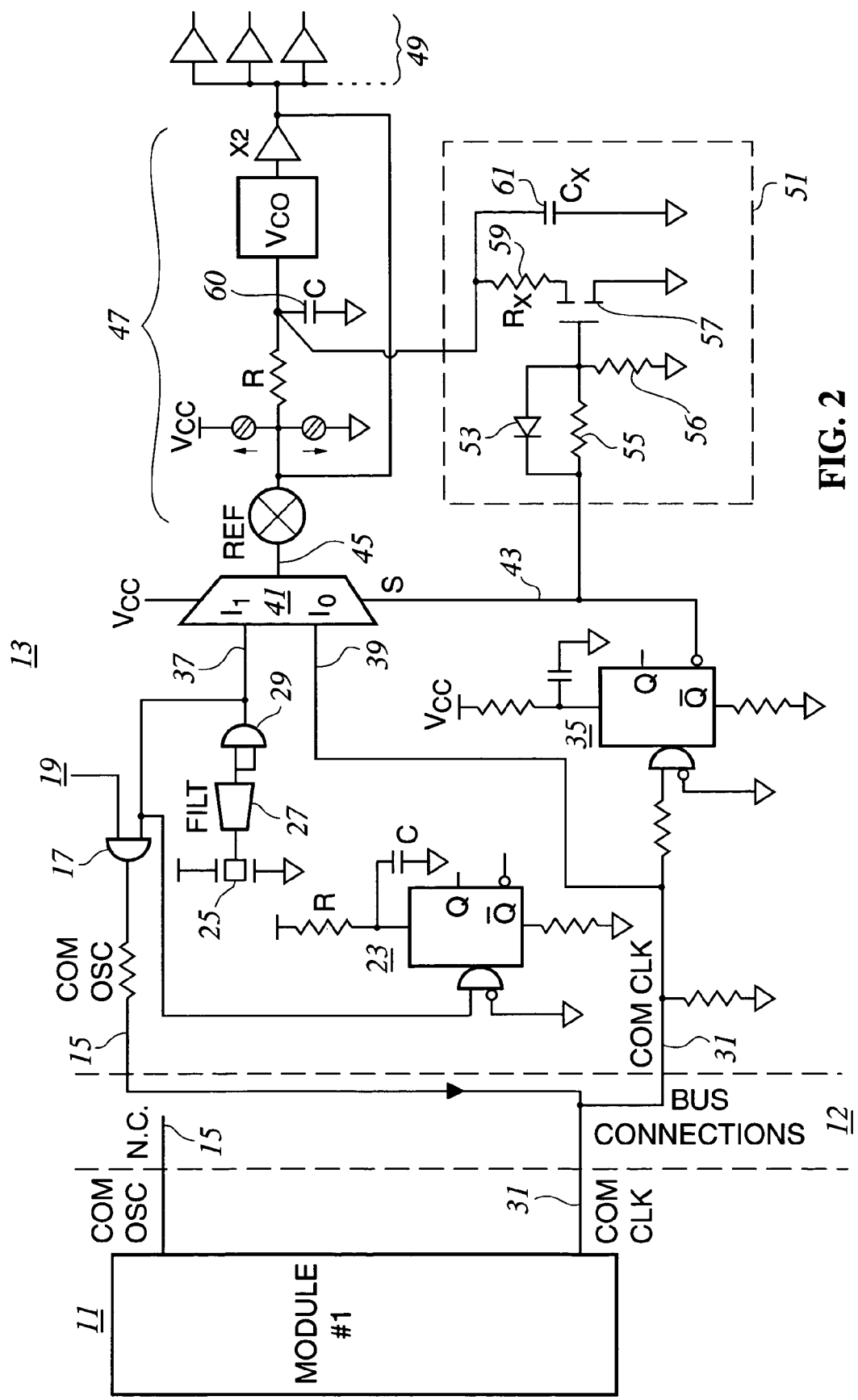
FIG. 2 depicts an implementation example of two identical processor modules interconnected by a bus, wherein each module includes the clocking circuitry in accordance with the present invention.

FIG. 2 depicts one possible implementation of the clocking circuitry of the present invention as applied to two processor modules, 11 and 13 interconnected by bus connections 12. Although the processor modules are identical, the bus connections designate module two 13 as a clock master and module one 11 as a clock slave. In this application, each module outputs to the bus a common oscillator signal 15 derived from its local clock. Each module also receives from the bus a common clock signal 31. In the depicted configuration, the master module's common oscillator output is tied to both modules common clock inputs. Furthermore, although a processor module has been used as an example herein, the clocking circuitry of the present invention has a variety of uses throughout the electronic arts.

The modules 11 and 13 are identical, and module one 11 will be described below by way of example. A multiplexer 41 is included in the circuit and selects between two clock signals. A crystal oscillator 25 in connection with filter 27 and buffer 29 provide a local clock signal 37 to multiplexer 41. A "Common clock" signal 31 is received over the bus and is also provided to multiplexer 41. Thus, multiplexer 41 may select from either local clock 37 or bus received common clock 39.

Local clock 37 is provided to multiplexer 41 and to several other circuits within the module. An AND gate 17 receives local clock 37 and a power check signal 19 that is received from the power supply and is raised when power to the module is verified. The resultant clock signal, common oscillator 15 is passed to the bus. Local clock 37 is also passed to retriggerable multivibrator 23. The time constant of multivibrator 23 is longer than the period of local clock 37 and therefore, if local clock 37 is present, a local oscillator "OK" signal is output from multivibrator 23 to the local microprocessor.

Common clock 39 is passed to both multiplexer 41 and retriggerable multivibrator 35. The time constant of multivibrator 35 is longer than the expected period of common clock such that the output 43 of multivibrator 35 will indicate the presence of common clock 39. The time constant of multivibrator 35 may actually be several cycles of the expected common clock to reduce its output's susceptibility to spurious noise on, and short outages of, common clock 39.

Output 43 of multivibrator 35 is passed to the input select line of multiplexer 41 such that multiplexer output 45 carries common clock 39 when common clock 39 is present, and carries local clock 37 when common clock 39 is absent.

Multiplexer output 45 is passed through a phase-locked loop ("PLL") circuit 47 to stabilize the frequency and provide frequency buffering during clock switchover. Further, the PLL circuit used provides a frequency-doubling feature. One example of a PLL circuit 47 is available as part number FCT88915TT from Integrated Device Technologies.

PLL 47 drives circuitry (e.g., microprocessor clocks) through buffers 49.

A high-speed feedforward oscillator correction circuit 51 is used to further stabilize PLL behavior during clock switchover. For example, during the period in which common clock has failed, and prior to switchover to the local clock, the PLL circuit will tend to change (e.g., increase) its frequency which may adversely affect driven circuits (e.g., microprocessor clocks). Feedforward circuit 51 stabilizes this effect by dynamically altering the PLL filter circuit during clock switchover.

Specifically regarding feed forward circuit 51, capacitor 61 increases the filter capacitance in the PLL loop thereby decreasing the slew rate of frequency changes.

Output 43 of multivibrator 35 drives FET 57 through a bias network including resistors 55–56 and diode 53. FET controllable couples resistor 59 into the discharge path of the PLL filter capacitance. Capacitor 60 represents the nominal capacitance associated with the printed circuit board and wiring thereon coupling PLL 47 to feed forward circuit 51.

Operationally, output 43 from multivibrator 35 is low when common clock 31 is present and high when common clock 31 is absent. Feedforward circuit 51 reacts to this condition by including resistor 59 in the PLL filter loop path to ground when common clock 31 is absent and disconnecting resistor 59 from the PLL filter loop when common clock is present.

When common clock 39 fails, PLL 47 will begin to increase its frequency in reaction thereto. However, the rate of this increase will be mitigated by capacitor 61. After the time constant of multivibrator 35 expires, its output goes high and resistor 59 is introduced into the PLL filter loop, providing an accelerated discharge path for the PLL filter capacitance and counteracting the tendency of PLL 47 to increase its frequency. Thus, frequency changes associated with clock failure, detection thereof and switchover are mitigated. Careful tuning of the time constants of the PLL circuit and multivibrator 35 can be used to optimize results.

Figure 3:
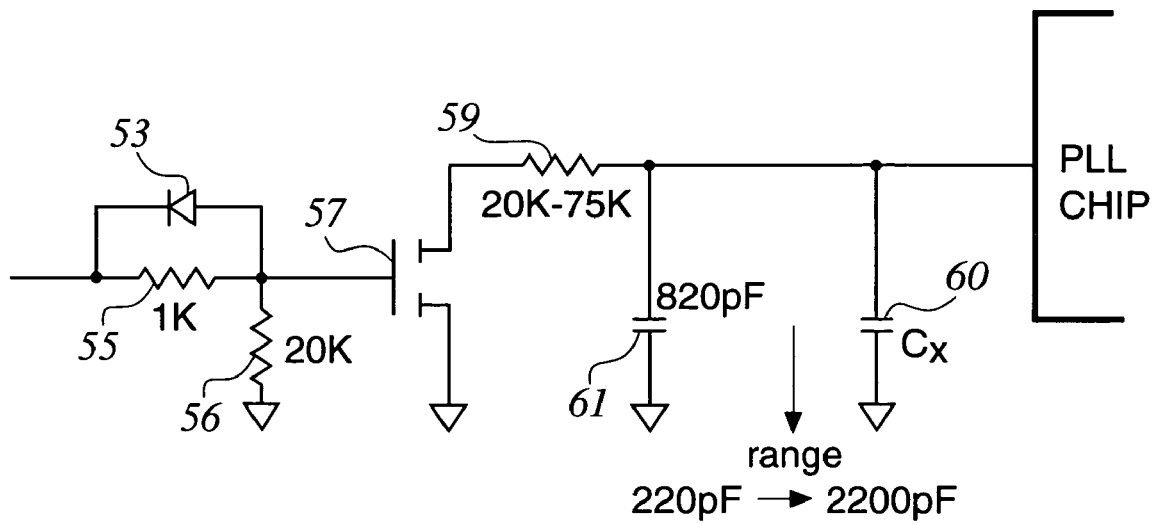
FIGS. 3–6 depict feedforward oscillator correction circuits according to embodiments of the present invention.
Figure 4:
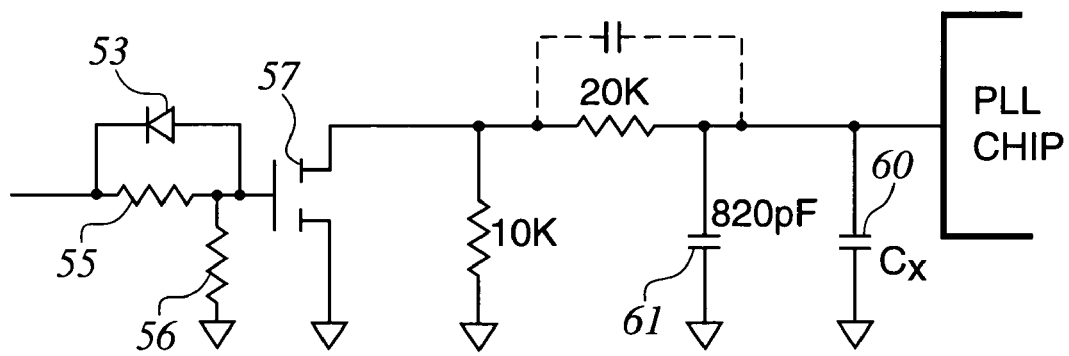
Figure 5:
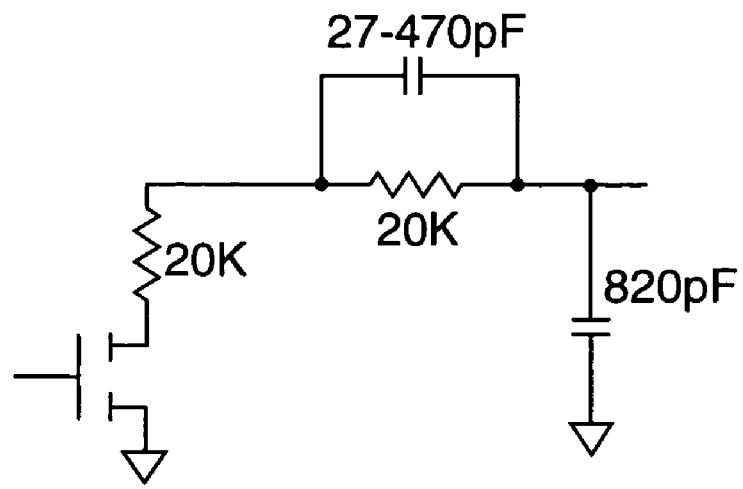
Figure 6:
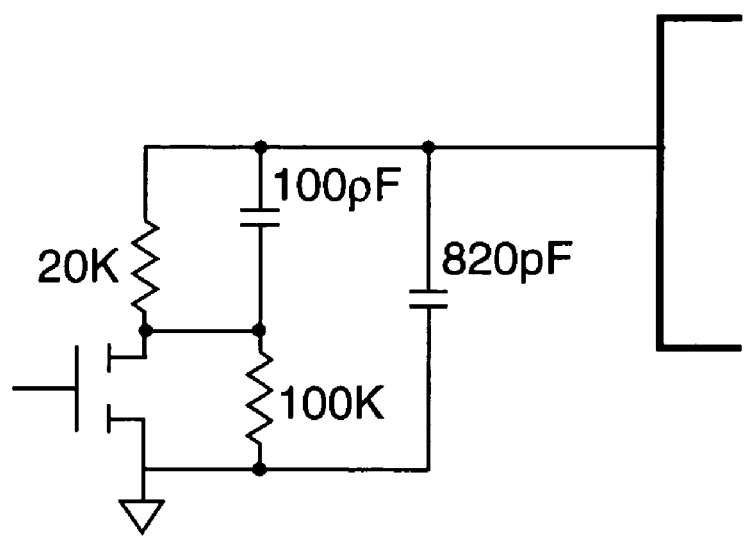

Depicted in FIG. 3 are examples of component values for one embodiment of feed forward circuit 51. Of course, these values are tunable to the particular application. FIGS. 4–6 represent alternate embodiments of feed forward circuit 51.

While the invention has been described in detail herein, in accordance with certain preferred embodiments thereof, many modifications and changes thereto may be affected by those skilled in the art. Accordingly, it is intended by the appended claims to cover all such modifications and changes as fall within the true spirit and scope of the invention.

What is claimed is:

1. A clock circuit comprising:
   first and second clock sources;
   a multiplexer having a first input coupled to the first clock source, a second input coupled to the second clock source, and an output selectively couplable to said first and second inputs;
   a clock detection circuit having an output representing a presence of said first clock source;
   said multiplexer having a selection input coupled to said clock detection circuit output such that said multiplexer selects said first clock source as its output when said first clock source is present;
   a phase-locked loop circuit ("PLL") having
      an input coupled to said multiplexer output; and
      a frequency output;
   said PLL including a feedback filter circuit; and
      feedforward circuitry coupled to said feedback filter circuit and to said clock detection circuit output, said feedforward circuitry selectively coupling at least one circuit element to said feedback filter circuit, wherein said feedforward circuitry selective coupling is controlled by said clock detection circuit output.

2. The circuit of claim 1, where said feedforward circuitry includes a switch controlled by said clock detection circuit output and performing said selective coupling.

3. The circuit of claim 2, wherein said switch comprises a transistor.

4. The circuit of claim 2, wherein said at least one circuit element includes a resistor.

5. The circuit of claim 4, wherein said at least one circuit element includes a capacitor in parallel with said resistor.

6. The circuit of claim 2, wherein said feedforward circuitry includes at least one of a resistor and a capacitor in parallel with said switch.

7. The circuit of claim 2, further including a bias circuit coupling said clock detection circuit output to said switch.

8. The circuit of claim 7, wherein said bias network includes a resistor based voltage divider.

9. The circuit of claim 8, further including a zener diode in parallel with at least one resistor of said resistor base voltage divider.

10. The circuit of claim 1, wherein said first clock source is received from another clock circuit within a common system.

11. The circuit of claim 10, wherein said first clock source is received over a bus.

12. The circuit of claim 11, wherein said second clock source comprises a local oscillator.

13. The circuit of claim 12, wherein said second clock source is provided to said bus.

14. A system comprising:
   multiple clock sources;
   a switch having multiple inputs, said multiple inputs being respectively coupled to said multiple clock sources;
   a clock detection circuit having an output representing a presence of one of said multiple clock sources;
   said switch having a selection input coupled to said clock detection circuit output such that said switch selects one particular clock source of said multiple clock sources as its output when said one particular clock source is present;
   a phase-locked loop circuit ("PLL") having
      an input coupled to said switch output; and
      a frequency output;
   said PLL including a feedback filter circuit; and
      feedforward circuitry coupled to said feedback filter circuit and to said clock detection circuit output, said feedforward circuitry selectively coupling at least one circuit element to said feedback filter circuit, wherein said feedforward circuitry selective coupling is controlled by said clock detection circuit output.

* * * * *